(12) United States Patent
Andosca et al.

(10) Patent No.: US 9,484,522 B2
(45) Date of Patent: Nov. 1, 2016

(54) PIEZOELECTRIC ENERGY HARVESTER DEVICE WITH CURVED SIDEWALLS, SYSTEM, AND METHODS OF USE AND MAKING

(71) Applicant: MicroGen Systems, Inc., West Henrietta, NY (US)

(72) Inventors: Robert G. Andosca, Fairport, NY (US); Kathleen M. Vaeth, Penfield, NY (US)

(73) Assignee: Microgen Systems, Inc., West Henrietta, NY (US)

( * ) Notice: Subject to any disclaimer, the term of this patent is extended or adjusted under 35 U.S.C. 154(b) by 234 days.

(21) Appl. No.: 14/145,534

(22) Filed: Dec. 31, 2013

(65) Prior Publication Data

US 2015/0188030 A1 Jul. 2, 2015

Related U.S. Application Data

(60) Provisional application No. 61/780,203, filed on Mar. 13, 2013.

(51) Int. Cl.
*H01L 41/113* (2006.01)
*H01L 41/332* (2013.01)
*H02N 2/18* (2006.01)

(52) U.S. Cl.
CPC ......... *H01L 41/1136* (2013.01); *H01L 41/332* (2013.01); *H02N 2/186* (2013.01)

(58) Field of Classification Search
CPC ...... F23Q 3/002; G01C 19/5607; G01L 1/16
USPC .................................................. 310/311–371
See application file for complete search history.

(56) References Cited

U.S. PATENT DOCUMENTS

| 4,445,256 | A | 5/1984 | Huguenin et al. |
| 5,248,912 | A | 9/1993 | Zdeblick et al. |
| 5,646,583 | A | 7/1997 | Seabury et al. |
| 5,708,320 | A | 1/1998 | Ohnishi et al. |
| 6,078,126 | A | 6/2000 | Rollins et al. |
| 6,396,201 | B1 | 5/2002 | Ide et al. |
| 6,796,011 | B2 | 9/2004 | Takeuchi et al. |
| 6,858,970 | B2 | 2/2005 | Malkin et al. |
| 7,839,058 | B1 | 11/2010 | Churchill et al. |

(Continued)

FOREIGN PATENT DOCUMENTS

| JP | 54-25192 A | * | 2/1979 | .................... 310/367 |
| WO | WO 03/096521 | | 11/2003 | |

OTHER PUBLICATIONS

International Search Report for International Patent Application No. PCT/US2014/035318 (Dec. 31, 2014).

(Continued)

*Primary Examiner* — Thomas Dougherty
(74) *Attorney, Agent, or Firm* — LeClairRyan, a Professional Corporation

(57) ABSTRACT

The present invention relates to an energy harvester device, which includes an elongate, planar resonator beam comprising a piezoelectric material and side walls extending between first and second ends; a base connected to the resonator beam at the first end with the second end being freely extending from the base as a cantilever; and a mass attached to the second end of the resonator beam. The side walls are continuously curved within the plane of the resonator beam. Also disclosed are a system containing the device, and methods of using and making the device.

24 Claims, 9 Drawing Sheets

(56) References Cited

U.S. PATENT DOCUMENTS

| | | | |
|---|---|---|---|
| 7,919,345 B1 | 4/2011 | Kirsten et al. | |
| 8,080,920 B2 | 12/2011 | Andosca et al. | |
| 8,319,402 B1 | 11/2012 | Churchill et al. | |
| 8,680,752 B2* | 3/2014 | Ayazi | F03G 7/08 310/339 |
| 2003/0214200 A1 | 11/2003 | Thompson et al. | |
| 2004/0115711 A1 | 6/2004 | Su et al. | |
| 2005/0028336 A1* | 2/2005 | Robert | H03H 3/04 29/25.35 |
| 2005/0134149 A1 | 6/2005 | Deng et al. | |
| 2005/0205125 A1 | 9/2005 | Nersessian et al. | |
| 2005/0253486 A1 | 11/2005 | Schmidt | |
| 2007/0125176 A1 | 6/2007 | Liu | |
| 2007/0284969 A1* | 12/2007 | Xu | H01L 41/1136 310/339 |
| 2009/0200896 A1 | 8/2009 | Morris et al. | |
| 2009/0284102 A1 | 11/2009 | Karakaya et al. | |
| 2010/0019623 A1 | 1/2010 | Yao et al. | |
| 2010/0072759 A1 | 3/2010 | Andosca et al. | |
| 2010/0194240 A1 | 8/2010 | Churchill et al. | |
| 2011/0264293 A1 | 10/2011 | Forrest et al. | |
| 2011/0277286 A1 | 11/2011 | Zhang | |
| 2011/0309618 A1 | 12/2011 | Gieras et al. | |
| 2012/0049694 A1 | 3/2012 | Van Schaijk et al. | |
| 2013/0088123 A1 | 4/2013 | Haskett | |
| 2013/0341936 A1 | 12/2013 | Wood et al. | |
| 2014/0265726 A1 | 9/2014 | Andosca | |

OTHER PUBLICATIONS

International Search Report, corresponding to PCT/US14/65628, mailed Jul. 24, 2015.
International Search Report for International Patent Application No. PCT/US2014/021905 (Aug. 15, 2014).
International Search Report for International Patent Application No. PCT/US2014/035296 (Aug. 22, 2014).
Altena G., et al., "Design improvements for an electret-based MEMS vibrational electrostatic energy harvester", Journal of Physics: Conference Series 476 (2013) 012078, PowerMEMS2013, pp. 371-374, IOP Publishing.
Andosca R., et al., "Experimental and theoretical studies on MEMS piezoelectric vibrational energy harvesters with mass loading", Sensors and Actuators A: Physical, 2012, pp. 1-12, Elsevier B.V.
Beeby et al., "Energy harvesting vibration sources for microsystems applications," Meas. Sci. Technol., Measurement Science and Technology, 2006, pp. R175-R195, IOP Publishing Ltd.
Elfrink R., et al., "Vaccum Packaged MEMS Piezoelectric Vibration Energy Harvester", PowerMEMS, 2009, pp. 67-70.
Gu L., et al., "Impact-driven, frequency up-converting coupled vibration energy harvesting device for low frequency operation", Smart Mater, Struct., 20, Mar. 8, 2011, pp. 1-10, IOP Publishing.
Marzencki, M., et al., "A MEMS Piezoelectric Vibration Energy Harvesting Device", PowerMEMS, Nov. 28-30, 2005, pp. 45-48.
Renaud M., et al., "Optimum power and efficiency of piezoelectric vibration energy harvesters with sinusoidal and random vibrations", J. Micromech, Microeng. 22, Sep. 10, 2012, pp. 1-13, IOP Publishing.
Schroder C., et al., "Wafer-Level Packaging of AlN-Based Piezoelectric Micropower Generators", PowerMEMS, Dec. 2-5, 2012, pp. 343-346.
Schroder C., et al., "AlN-Based Piezoelectric Micropower Generator for Low Ambient Vibration Energy Harvesting", 2011, pp. 1-4.
Singh K., et al., "Piezoelectric vibration energy harvesting system with an adaptive frequency tuning mechanism for intelligent tires", Mechatronics 22, Jul. 31, 2012, pp. 970-988, Elsevier, Ltd.
Stoppel et al., "A1N-Based piezoelectric micropower generator for low ambient vibration energy harvesting," Porcedia Engineer. 25, Sep. 4-7, 2011, pp. 721-724, Elsevier, Ltd.
Tang L., et al., "Toward Broadband Vibration-based Energy Harvesting", Journal of Intelligent Material Systems and Structures, vol. 21, Dec. 2010, pp. 1867-1897, Sage Publications.
Schaijk, R., et al., "A MEMS vibration energy harvester for automotive applications", Proc. of SPIE vol. 8763, 2013, pp. 1-10.
Wang Z., et al., "Shock Reliability of Vacuum-Packaged Piezoelectric Vibration Harvester for Automotive Application", Journal of Microelectromechanical Systems, vol. 23, No. 3, Jun. 2014, pp. 539-548, IEEE.
Zhu D., et al., "Strategies for increasing the operating frequency range of vibration energy harvesters: a review", Meas. Sci. Technol. 21, Dec. 15, 2010, pp. 1-29, IOP Publishing.
International Search Report for International Patent Application No. PCT/US2014/014797 (May 23, 2014).
International Search Report for International Patent Application No. PCT/US2013/78520 (May 4, 2014).
European Search Report for European Application No. 13877574.7 (Aug. 1, 2016), pp. 1-6.
International Search Report for International Patent Application No. PCT/US2014/014797 (Aug. 18, 2016), pp. 1-6.

* cited by examiner

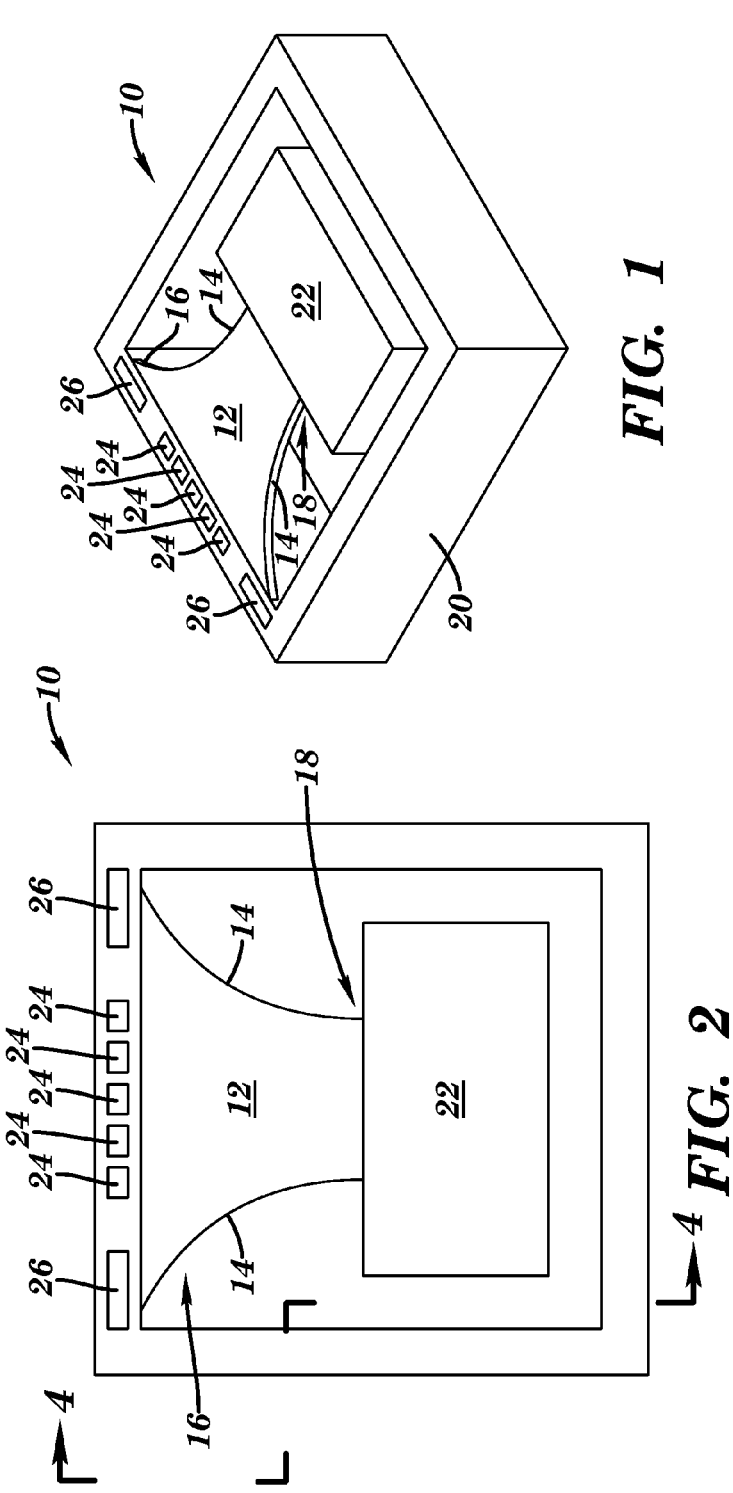

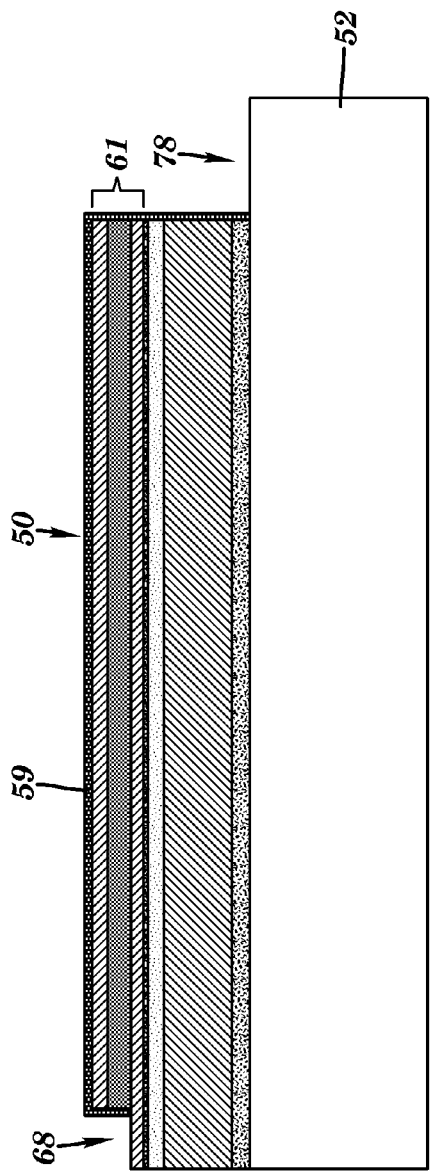
FIG. 16
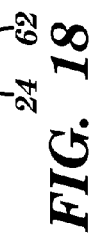
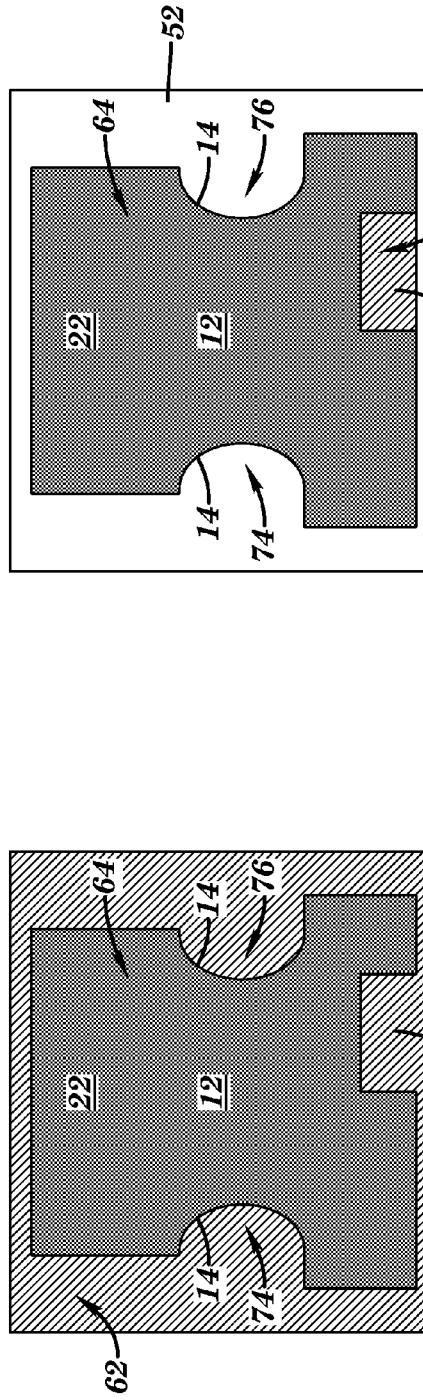
FIG. 17
FIG. 18

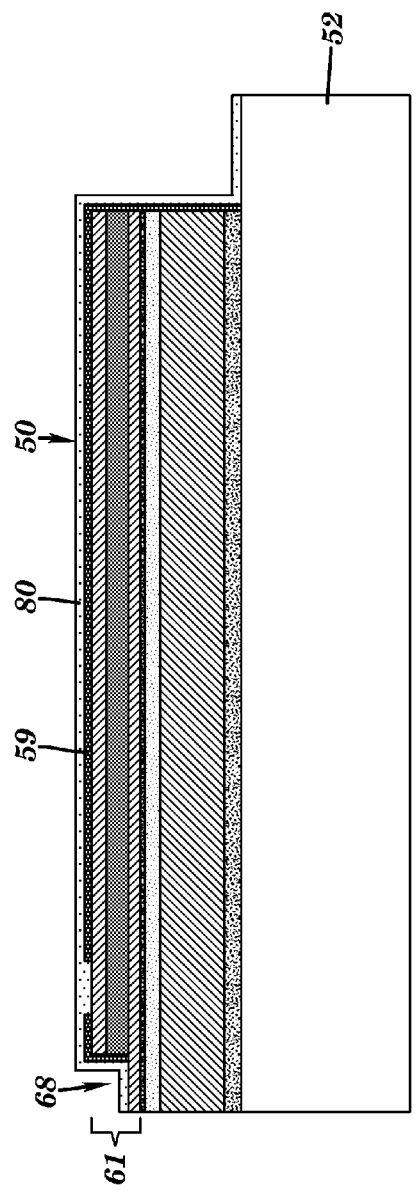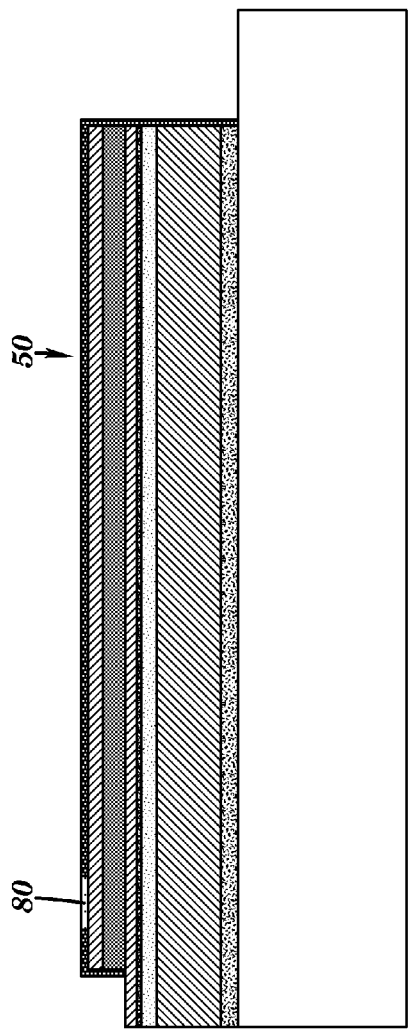

PIEZOELECTRIC ENERGY HARVESTER DEVICE WITH CURVED SIDEWALLS, SYSTEM, AND METHODS OF USE AND MAKING

This application claims the priority benefit of U.S. Provisional Patent Application Ser. No. 61/780,203, filed Mar. 13, 2013, which is hereby incorporated by reference in its entirety.

FIELD OF THE INVENTION

The present invention relates to a piezoelectric energy harvester device with curved sidewalls, a system containing the device, and methods of using and making the device.

BACKGROUND OF THE INVENTION

Reduction in both size and power consumption of integrated circuits has led to the proliferation of wireless technology. For example, there is a wide variety of devices using low-power wireless circuits; including tablets; smartphones; cell phones; laptop computers; MP3 players; telephony headsets; headphones; routers; gaming controllers; mobile internet adaptors; wireless sensors; tire pressure sensor monitors; wearable sensors that communicate with tablets, PCs, and/or smartphones; devices for monitoring livestock; medical devices; human body monitoring devices; toys; etc. Each of these devices requires a standalone power supply to operate. Typically, power supplies for these devices are electrical batteries, often replaceable batteries.

Other wireless technologies of significant interest are wireless sensors and wireless sensor networks. In such networks, wireless sensors are distributed throughout a particular environment to form an ad hoc network that relays measurement data to a central hub. Particular environments include, for example, an automobile, an aircraft, a factory, or a building. A wireless sensor network may include several to tens of thousands of wireless sensor "nodes" that operate using multi-hop transmissions over distances. Each wireless node will generally include a sensor, wireless electronics, and a power source. These wireless sensor networks can be used to create an intelligent environment responding to environmental conditions.

A wireless sensor node, like the other wireless devices mentioned above, requires standalone electrical power to operate the electronics of that node. Conventional batteries, such as lithium-ion batteries, zinc-air batteries, lithium batteries, alkaline batteries, nickel-metal-hydride batteries, and nickel-cadmium batteries, could be used. However, it may be advantageous for wireless sensor nodes to function beyond the typical lifetime of such batteries. In addition, battery replacement can be burdensome, particularly in larger networks with many nodes.

Alternative standalone power supplies rely on scavenging (or "harvesting") energy from the ambient environment. For example, if a power-driven device is exposed to sufficient light, a suitable alternative standalone power supply may include photoelectric or solar cells. Alternatively, if the power-driven device is exposed to sufficient air movement, a suitable alternative standalone power supply may include a turbine or micro-turbine for harvesting power from the moving air. Other alternative standalone power supplies could also be based on temperature fluctuations, pressure fluctuations, or other environmental influences.

Some environments do not include sufficient amounts of light, air movement, temperature fluctuation, and/or pressure variation to power particular devices. Under such environments, the device may nevertheless be subjected to fairly predictable and/or constant vibrations, e.g., emanating from a structural support, which can be in the form of either a vibration at a constant frequency, or an impulse vibration containing a multitude of frequencies. In such cases, a scavenger (or harvester) that essentially converts movement (e.g., vibrational energy) into electrical energy can be used.

One particular type of vibrational energy harvester utilizes resonant beams that incorporate a piezoelectric material that generates electrical charge when strained during resonance of the beams caused by ambient vibrations (driving forces).

Flatness and resonant frequency of microelectromechanical ("MEMS") cantilever structures used for piezoelectric energy harvesting are important for their efficient operation. Typical MEMS cantilever structures used in energy harvesting devices are a laminate of multiple layers, each with a specific function (strength, resonant frequency tuning, conduction, piezoelectric harvesting). The residual stress of each layer must be strictly controlled to produce a flat structure. The buckling or cupping in the cantilever due to poor residual stress control can impact the full width half maximum of the resonant response, maximum power, quality factor (damping coefficient), and robustness of the device. One way reported in the literature to mitigate some of these issues is to angle or taper the cantilever in the plane parallel to the substrate. However, this does not relieve all of the stress "hotspots" observed. Further structuring the cantilever sidewall shape to follow the stress contours of the laminate allows for another degree of freedom in engineering the flatness of the cantilever.

Moreover, in some instances, efficient operation of MEMS cantilever structures for piezoelectric energy harvesting also requires precise tuning of the peak resonant response. Changing the taper angle of the cantilever in the plane parallel to the substrate impacts the resonant frequency by reducing the stiffness of the beam. However, this approach can also lead to poor clamping of the end mass and subsequent robustness issues.

The present invention is directed to overcoming these and other deficiencies in the art.

SUMMARY OF THE INVENTION

One aspect of the present invention relates to an energy harvester device, which includes an elongate, planar resonator beam comprising a piezoelectric material and side walls extending between first and second ends; a base connected to the resonator beam at the first end with the second end being freely extending from the base as a cantilever; and a mass attached to the second end of the resonator beam. The side walls are continuously curved within the plane of the resonator beam.

Another aspect of the present invention relates to a system comprising an electrically powered apparatus and the energy harvester device of the present invention electrically coupled to the electrically powered apparatus.

A further aspect of the present invention relates to a method of powering an electrically powered apparatus. This method involves providing the system of the present invention; subjecting the system to movement or vibrations to generate electrical energy from the piezoelectric material; and transferring the electrical energy from the piezoelectric material to the apparatus to provide power to the apparatus.

Yet another aspect of the present invention relates to a method of producing an energy harvester device. This method involves providing a silicon wafer having a first and second surface; depositing a first silicon dioxide layer on the first surface of the silicon wafer; depositing a cantilever material on the first silicon dioxide layer; depositing a second silicon dioxide layer on the cantilever material; depositing a piezoelectric stack layer on the second silicon dioxide layer; patterning the piezoelectric stack layer; patterning the second silicon dioxide layer, the cantilever material, and the first silicon dioxide layer; and etching the second surface of the silicon wafer to produce the energy harvester device.

The present invention is directed to a piezoelectric energy harvester device that has, as an advantage over other such devices, a robust cantilever. In particular, using continuously curved resonator beam sidewalls instead of straight sidewalls (including tapered sidewalls) allows for an additional degree of freedom in resonant frequency tuning of the resonator beam while maintaining good mechanical properties of the resonator, such as (but not limited to) strong attachment of the resonator beam to the base.

BRIEF DESCRIPTION OF THE DRAWINGS

FIG. 1 is a perspective view of one embodiment of an energy harvester device of the present invention, which includes a resonator beam comprising a piezoelectric material and side walls extending between first and second ends; a base connected to the resonator beam at the first end with the second end being freely extending from the base as a cantilever; and a mass attached to the second end of the resonator beam. The side walls are continuously curved.

FIG. 2 is a top view of the energy harvester device illustrated in FIG. 1.

FIG. 3 is a side view of the energy harvester device illustrated in FIG. 1, showing one embodiment of a base, which surrounds on four sides a resonator beam connected to the base.

FIG. 4 is a side, cut-away view of the energy harvester device shown in FIG. 2, with portions of the base cut away along section 4 shown in FIG. 2 to show side views of the resonator beam and mass that form the energy harvester device.

FIG. 16 is a side view of the layered material stack of FIG. 14, which has been patterned, according to one embodiment of the method of producing an energy harvesting device of the present invention, to remove a portion of the third silicon dioxide layer to leave a portion of the piezoelectric stack and a portion of the silicon wafer exposed.

FIG. 17 is a top view of the patterned layered material stack of FIG. 13.

FIG. 18 is a top view of the patterned layered material stack of FIG. 14, showing a cantilever material layer having side walls continuously curved within a single plane.

FIG. 19 is a side view of the layered material stack of FIG. 16, in which a metal bondpad layer has been deposited over the patterned third silicon dioxide layer, and portions of the piezoelectric stack and silicon wafer.

FIG. 20 is a side view of the layered material stack of FIG. 19, which has been patterned to remove portions of the metal bondpad layer.

DETAILED DESCRIPTION OF THE INVENTION

Figure 5:
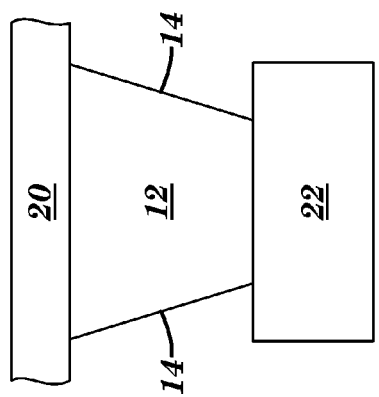
FIG. 5 is a top view of a portion of one embodiment of an energy harvester device of the prior art, which focuses on the shape of the resonator beam. The resonator beam, which has a first end connected to a base and a second end connected to a mass, is shown to have straight side walls which taper from the first end toward the second end.

The present invention relates to a piezoelectric energy harvester device, a system comprising the piezoelectric energy harvester device, and methods of using and making the piezoelectric energy harvester device. The piezoelectric energy harvester device of the present invention has a more robust cantilever structure than such devices taught in the prior art. In particular, using continuously curved resonator beam sidewalls instead of straight side walls allows for an additional degree of freedom in resonant frequency tuning of the resonator beam while maintaining good attachment of the resonator beam to the base.

One aspect of the present invention relates to an energy harvester device, which includes an elongate, planar resonator beam comprising a piezoelectric material and side walls extending between first and second ends; a base connected to the resonator beam at the first end with the second end being freely extending from the base as a cantilever; and a mass attached to the second end of the resonator beam. The side walls are continuously curved within the plane of the resonator beam.

FIG. 1 is a perspective view of one embodiment of an energy harvester device of the present invention. Energy harvester device 10 includes resonator beam 12 comprising a piezoelectric material and side walls 14 extending between first end 16 of resonator beam 12 and second end 18 of resonator beam 12. Base 20 is connected to resonator beam 12 at first end 16 with second end 18 being freely extending from base 20 as a cantilever. Energy harvester device 10 also includes mass 22 attached to second end 18 of resonator beam 12. Side walls 14 are continuously curved from first end 16 to second end 18 of resonator beam 12.

Energy harvester device 10 also includes one or more electrodes 24 in electrical contact with the piezoelectric material of resonator beam 12. According to one embodiment, electrodes 24 comprise a material selected from the group consisting of molybdenum and platinum, although other materials suitable for forming electrode structures may also be used. In addition, energy harvester device 10 further includes electrical harvesting circuitry 26 in electrical connection with one or more electrodes 24 to harvest electrical energy from the piezoelectric material of resonator beam 12. As described in further detail below, electrical harvesting circuitry 26 can be electrically coupled to an electrically powered apparatus to provide power generated from the piezoelectric material and supplied to the apparatus. In one embodiment, electrical harvesting circuitry 26 is integrated with energy harvester device 10. However, in another embodiment, the electrical harvesting circuitry is not integrated with the energy harvester device. For example, the electrical harvesting circuitry may be a separate chip or board or is present on a separate chip or board.

As illustrated in FIG. 1, energy harvester device 10 is in the form of an integrated, self-packaged unit. In particular, base 20 is shown to surround the cantilever structure (i.e., resonator beam 12 and mass 22) on four sides. Other packaging of energy harvester device 10 may also be used, e.g., where base 20 totally encloses the cantilever structure of resonator beam 12 and mass 22, or where base 20 is nothing more than a connection site for first end 16 of resonator beam 12.

Alternative views of energy harvester device 10 of FIG. 1 are illustrated in FIG. 2 (a top view), FIG. 3 (a side view), and FIG. 4 (a side, cut away view along lines 4 of FIG. 2).

Resonator beam 12 of energy harvester device 10 comprises a piezoelectric material. Piezoelectric materials are materials that when subjected to mechanical strain become electrically polarized. The degree of polarization is proportional to the applied strain. Piezoelectric materials are widely known and available in many forms including single crystal (e.g., quartz), piezoceramic (e.g., lead zirconate titanate or PZT), thin film (e.g., sputtered zinc oxide), screen printable thick-films based upon piezoceramic powders (see, e.g., Baudry, "Screen-printing Piezoelectric Devices," *Proc. 6th European Microelectronics Conference* (London, UK) pp. 456-63 (1987) and White & Turner, "Thick-film Sensors: Past, Present and Future," *Meas. Sci. Technol.* 8:1-20 (1997), which are hereby incorporated by reference in their entirety), and polymeric materials such as polyvinylidenefluoride ("PVDF") (see, e.g., Lovinger, "Ferroelectric Polymers," *Science* 220:1115-21 (1983), which is hereby incorporated by reference in its entirety).

Piezoelectric materials typically exhibit anisotropic characteristics. Thus, the properties of the material differ depending upon the direction of forces and orientation of the polarization and electrodes. The level of piezoelectric activity of a material is defined by a series of constants used in conjunction with the axes of notation. The piezoelectric strain constant, d, can be defined as $$d = \frac{\text{strain developed}}{\text{applied field}} \text{m/V}$$

(Beeby et al., "Energy Harvesting Vibration Sources for Microsystems Applications," *Meas. Sci. Technol.* 17:R175-R195 (2006), which is hereby incorporated by reference in its entirety).

In the energy harvester device of the present invention, resonator beam 12 has second end 18, which is freely extending from base 20 as a cantilever. A cantilever structure comprising piezoelectric material is designed to operate in a bending mode thereby straining the piezoelectric material and generating a charge from the d effect (Beeby et al., "Energy Harvesting Vibration Sources for Microsystems Applications," *Meas. Sci. Technol.* 17:R175-R195 (2006), which is hereby incorporated by reference in its entirety). A cantilever provides low resonant frequencies, reduced further by the presence of mass 22 attached at second end 18 of resonator beam 12.

Resonant frequencies of resonator beam 12 of energy harvester device 10 of the present invention in operation may include frequencies of about 50 Hz to about 4,000 Hz, about 100 Hz to about 3,000 Hz, about 100 Hz to about 2,000 Hz, or about 100 Hz to about 1,000 Hz.

According to one embodiment, resonator beam 12 comprises a laminate formed of a plurality of layers, at least one of which comprises a piezoelectric material. Suitable piezoelectric materials include, without limitation, aluminum nitride, zinc oxide, PVDF, and lead zirconate titinate based compounds. Other non-piezoelectric materials may also be used as layers along with a layer of piezoelectric material.

Non-limiting examples of other layers include those described below with respect to the layered material stack (50) of FIG. 11.

Figure 6:
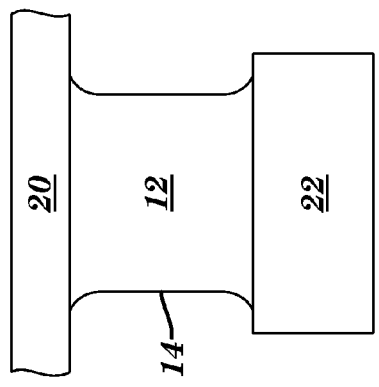
FIG. 6 is a top view of a portion of one embodiment of an energy harvester device of the prior art, which focuses on the shape of the resonator beam. The resonator beam, which has a first end connected to a base and a second end connected to a mass, is shown to have side walls which have curvature, but are not continuously curved from the first end of the resonator beam to the second end of the resonator beam.

As noted above, side walls 14 of resonator beam 12 are continuously curved within the plane of the resonator beam. Various types of continuous curvature may be employed, as illustrated in FIGS. 1, 2, and 7-9. By "continuous," it is meant that side wall 14 of resonator beam 12 has a curved shape from its attachment of first end 16 at base 20 to mass 22 at second end 18. This continuously curved structure is distinguishable from the linear structure of side walls 14 of resonator beam 12 illustrated in FIG. 5 (prior art) and the partially linear structure of side walls 14 of resonator beam 12 illustrated in FIG. 6 (prior art).

Figure 7:
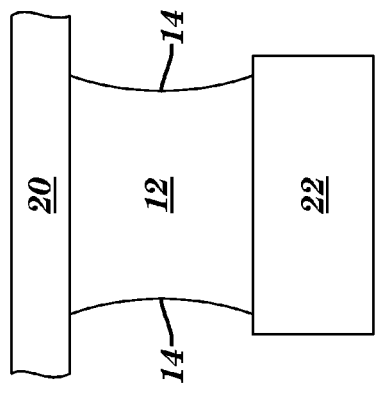
FIG. 7 is a top view of a portion of one embodiment of an energy harvester device of the present invention, which focuses on the shape of the resonator beam. The resonator beam, which has a first end connected to a base and a second end connected to a mass, is shown to have continuously curved side walls. The width of the first end of the resonator beam is approximately equal to the width of the second end of the resonator beam.

According to one embodiment illustrated in FIG. 7, the curvature of side walls 14 of resonator beam 12 is such that first end 16 of resonator beam 12 and second end 18 of resonator beam 12 have equal (or near equal) width.

Figure 8:
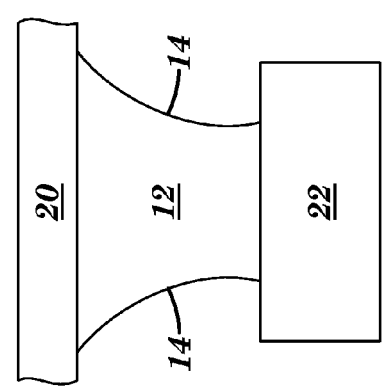
FIG. 8 is a top view of a portion of one embodiment of an energy harvester device of the present invention, which focuses on the shape of the resonator beam. The resonator beam, which has a first end connected to a base and a second end connected to a mass, is shown to have continuously curved side walls. The width of the first end of the resonator beam is greater than the width of the second end of the resonator beam.

According to another embodiment illustrated in FIG. 8, the curvature of side walls 14 of resonator beam 12 is such that first end 16 of resonator beam 12 has a width greater than that of second end 18 of resonator beam 12.

Figure 9:
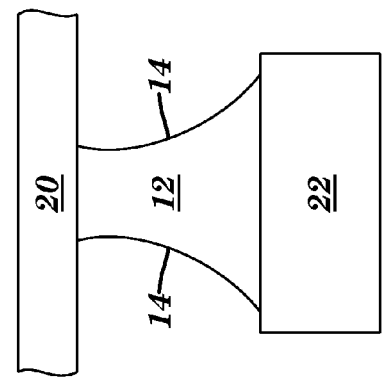
FIG. 9 is a top view of a portion of one embodiment of an energy harvester device of the present invention, which focuses on the shape of the resonator beam. The resonator beam, which has a first end connected to a base and a second end connected to a mass, is shown to have continuously curved side walls. The width of the first end of the resonator beam is less than the width of the second end of the resonator beam.

According to a further embodiment illustrated in FIG. 9, the curvature of side walls 14 of resonator beam 12 is such that first end 16 of resonator beam 12 has a width less than that of second end 18 of resonator beam 12.

As illustrated in FIGS. 7-9, side walls 14 of resonator beam 12 all have a concave shape, although other types of curvature may be used.

Energy harvester device 10 of the present invention includes mass 22 at second end 18 of resonator beam 12. Mass 22 is provided to lower the frequency of resonator beam 12 and also to increase the power output of resonator beam 12 (i.e., generated by the piezoelectric material). Mass 22 may be constructed of a single material or multiple materials (e.g., layers of materials). According to one embodiment, mass 22 is formed of silicon water material. Other suitable materials include, without limitation, copper, gold, and nickel deposited by electroplating or thermal evaporation.

In one embodiment, a single mass 22 is provided per resonator beam 12. However, more than one mass 22 may also be attached to resonator beam 12. In other embodiments, mass 22 is provided, for example, at differing locations along resonator beam 12.

As those skilled in the art will readily appreciate, resonator beam 12 can be tuned by varying any one or more of a number of parameters, such as the cross-sectional shape of resonator beam 12, cross-sectional dimensions of resonator beam 12, the length of resonator beam 12, the mass of mass 22, the location of mass 22 on resonator beam 12, and the materials used to make resonator beam 12.

In operation, one or more electrodes 24 harvest charge from the piezoelectric material of resonator beam 12 as resonator beam 12 is subject to movement. Accordingly, electrodes 24 are in electrical connection with the piezoelectric material of resonator beam 12.

Electrical energy collected from the piezoelectric material of resonator beam 12 is then communicated to electrical harvesting circuitry 26.

Another aspect of the present invention relates to a system comprising an electrically powered apparatus and the energy harvester device of the present invention electrically coupled to the electrically powered apparatus.

Figure 10:
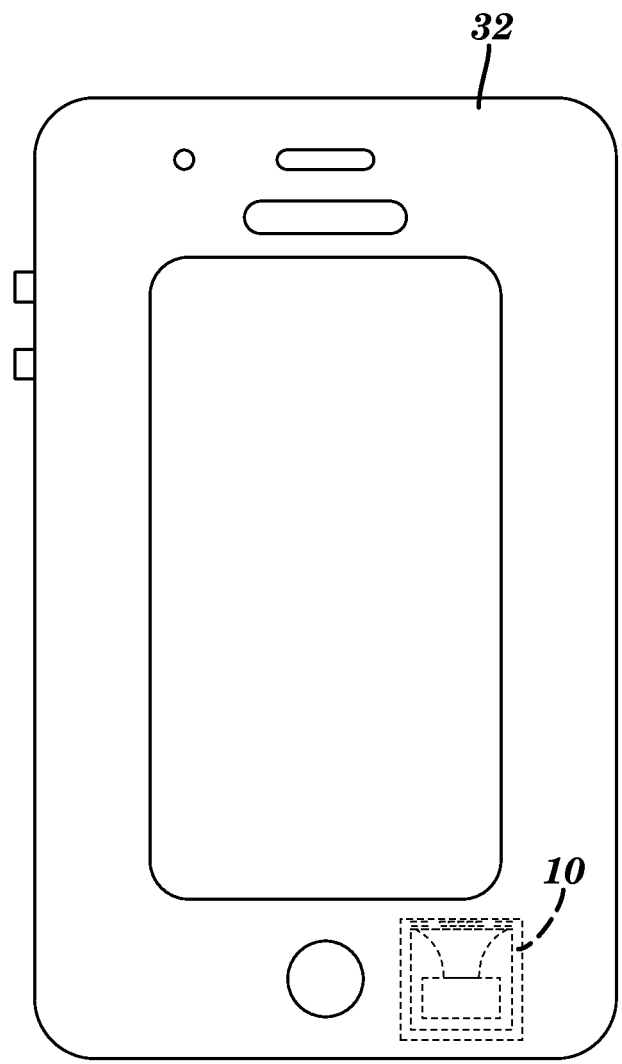
FIG. 10 illustrates one embodiment of a system of the present invention which includes an electrically powered smart phone containing an energy harvester device of the present invention which is electrically coupled to the smart phone to provide electrical energy to power the smart phone.

Turning now to FIG. 10, electrically powered apparatus (smartphone) 32 is shown to contain (within its exterior housing) energy harvester device 10. According to this embodiment, energy harvester device 10 provides a standalone source of energy to power smartphone 32, which is used in place of or in conjunction with another standalone energy source (e.g., a battery). In an alternative embodiment, the electrically powered apparatus is, e.g., a wearable device, such as a wrist watch-type device or necklace that electronically communicates with a tablet, PC, and/or smartphone.

Other systems of the present invention that include an electrically powered apparatus and the energy harvester device of the present invention include, without limitation, a laptop computer; a tablet computer; a cell phone; an e-reader; an MP3 player; a telephony headset; headphones; a router; a gaming device; a gaming controller; a mobile internet adapter; a camera; wireless sensors; wearable sensors that communicate with tablets, PCs, and/or smartphones; wireless sensor motes (for networks monitoring industrial, rail, buildings, agriculture, etc.); tire pressure sensor monitors; electronic displays (e.g., on power tools); agriculture devices for monitoring livestock; medical devices; human body monitoring devices; and toys.

For example, according to one embodiment, the system of the present invention is a wireless sensor device containing a sensor to monitor, e.g., any one or more various environmental properties (temperature, humidity, light, sound, vibration, wind, movement, etc.). The energy harvester device of the present invention is coupled to the sensor to provide power to the sensor.

According to one example, the system of the present invention is a tire-pressure monitoring system containing a sensor to monitor tire pressure. The energy harvester device of the present invention is coupled to the sensor to provide power. Such a system may be formed as a small device mounted, e.g., on a wheel or tire of an automobile.

According to another example, the system of the present invention is a humidity sensor in communication with electronic controls of a household or commercial clothes drier. The energy harvester device of the present invention is coupled to the sensor to provide power. Such a system may be formed as a small device mounted, e.g., on the inside of a clothes drier to monitor the dryness of clothes based on humidity levels in the clothes drier. Alternatively, the device is not mounted on the inside of a clothes drier, but is, e.g., a device that can be tossed into the drier with clothes (e.g., a ball). The sensor could then communicate with the electronic controls of the clothes drier to determine, e.g., the end of a cycle.

A further aspect of the present invention relates to a method of powering an electrically powered apparatus. This method involves providing the system of the present invention; subjecting the system to movement or vibrations to generate electrical energy from the piezoelectric material; and transferring the electrical energy from the piezoelectric material to the apparatus to provide power to the apparatus.

Another aspect of the present invention relates to a method of producing an energy harvester device. This method involves providing a silicon wafer having a first and second surface; depositing a first silicon dioxide ($SiO_2$) layer on the first surface of the silicon wafer; depositing a cantilever material on the first silicon dioxide layer; depositing a second silicon dioxide layer on the cantilever material; depositing a piezoelectric stack layer on the second silicon dioxide layer; patterning the piezoelectric stack layer; patterning the second silicon dioxide layer, the cantilever material, and the first silicon dioxide layer; and etching the second surface of the silicon wafer to produce the energy harvester device.

According to one embodiment, the method of the present invention may further involve depositing a third silicon dioxide layer over the patterned piezoelectric stack layer and the patterned second silicon dioxide layer, cantilever material, and first silicon dioxide layer and patterning the third silicon dioxide layer. According to another embodiment, the method of the present invention may further involve depositing a metal bondpad layer over the patterned third silicon dioxide layer and patterning the metal bondpad layer.

Figure 11:
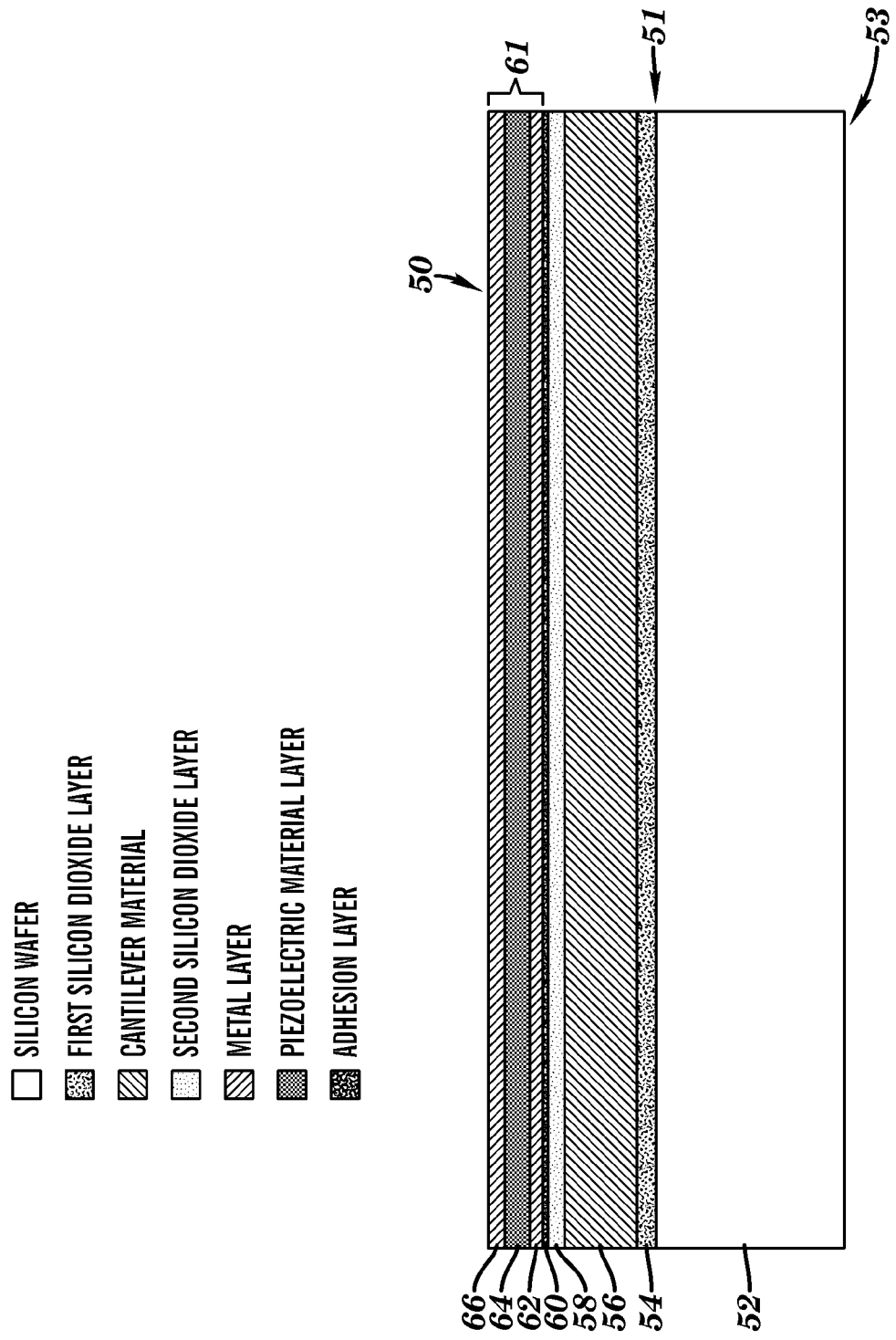
FIG. 11 is a side view of a layered material stack for producing one embodiment of an energy harvester device of the present invention. The layered material stack includes a silicon wafer, a first silicon dioxide layer, a cantilever material, a second silicon dioxide layer, an optional adhesion layer, a first metal layer, a piezoelectric material layer, and a second metal layer.

With reference now to FIG. 11, one embodiment of the method of producing the energy harvester device of the present invention involves forming layered material stack 50, which is a stack of layered materials that is patterned to form an energy harvester device as described herein. Layered material stack 50 includes the following layered materials: silicon wafer 52 (which has first surface 51 and second surface 53), first silicon dioxide layer 54, cantilever material 56, second silicon dioxide layer 58, adhesion layer 60 (which is optional), and piezoelectric stack layer 61 (comprising first metal layer 62, piezoelectric material layer 64, and second metal layer 66).

As illustrated in FIG. 11, the method of forming the energy harvester device of the present invention involves forming layered material stack 50 by providing silicon wafer 52 having first surface 51 and second surface 53, depositing first silicon dioxide layer 54 on first surface 51 of silicon wafer 52, depositing cantilever material 56 on first silicon dioxide layer 54, depositing second silicon dioxide layer 58 on cantilever material 56, depositing optional adhesion layer 60 on second silicon dioxide layer 58, and depositing piezoelectric stack layer 61 on second silicon dioxide layer 58.

Silicon wafer 52 is, according to one embodiment, a single crystal double-sided polished silicon wafer. In one embodiment, silicon wafer 52 has a thickness of about 400 μm to about 1,000 μm, about 500 μm to about 900 μm, about 600 μm to about 800 μm, or about 700 μm. In one specific example, silicon wafer 52 is a double-sided polished silicon wafer having a thickness of approximately 725 μm (+/−15 μm) (i.e., the standard thickness for 8 inch wafers). Alternatively, in place of silicon wafer 52, the method of the present invention may begin with a deposited layer of silicon dioxide upon which the subsequent layers of layered material stack 50 are formed.

First silicon dioxide layer 54 is, according to one embodiment, a thermal oxide layer. Silicon dioxide layer 54 provides an etch stop for the backside etch stop that releases cantilever material 56 and, when the mass is made of silicon, also defines the mass. In one embodiment, first silicon dioxide layer 54 has a thickness of about 0.25 μm to about 2 μm. Deposition of first silicon dioxide layer 54 onto silicon wafer 52 can be carried out by methods known in the art. For example, silicon dioxide may be thermally grown and then deposited on the silicon wafer. In one particular example, one (1) μm (+/−0.05 μm) of thermally grown $SiO_2$ is deposited onto silicon wafer 52 to form silicon dioxide layer 54.

Cantilever material 56 may be any suitable material such as silicon, polySi, metal (e.g., Cu or Ni), or other metal oxide semiconductor (CMOS) compatible material, or a high temperature polymer such as polyimide. In one embodiment, cantilever material 56 is deposited on first silicon dioxide layer 54 by chemical vapor deposition at a thickness range of about 10 μm to about 200 μm, about 10 μm to about 75 μm, or about 10 μm to about 50 μm. Following deposition, it may be desirable to smooth the surface of cantilever material 56, e.g., by chemical mechanical polish.

Second silicon dioxide layer 58 is, according to one embodiment, a high temperature oxide layer. This layer provides a surface upon which piezoelectric stack layer 61 can adhere well to, as well as an etch stop for patterning a bottom electrode of piezoelectric stack layer 61. In one embodiment, second silicon dioxide layer 58 is deposited onto cantilever material 56 by chemical vapor deposition at a thickness of about 1 μm.

Piezoelectric stack layer 61 is deposited on to second silicon dioxide layer 58 to form a metal/piezoelectric material/metal layer. According to one embodiment, piezoelectric stack layer 61 has a thickness of about 0.5 μm to about 6 μm, or about 2 μm to about 5 μm in thickness. First metal layer 62 and second metal layer 66 may be formed of any suitable metals that adequately function as an electrode. According to one embodiment, these layers are formed of the same material, such as molybdenum or platinum. However, both layers need not be formed of the same material. Piezoelectric material layer 64 is formed of any suitable piezoelectric material, as discussed above. According to one embodiment, this layer is formed of aluminum nitride (AlN).

Deposition of piezoelectric stack layer 61 may be carried out with thin adhesion layer 60 underneath as is standard in the art. Suitable adhesion layers 60 may include materials such as titanium, AlN, Al:Cu, or Al at a layer thickness of about 0.02 jam to about 0.05 μm.

Figure 12:
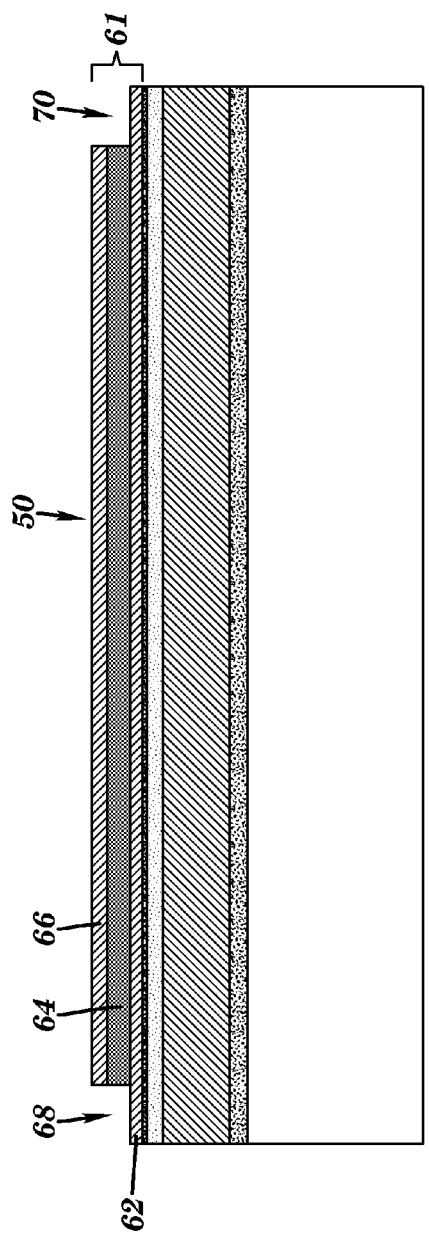
FIG. 12 is a side view of the layered material stack of FIG. 11, which has been patterned, according to one embodiment of the method of producing an energy harvester device of the present invention, to remove portions of the piezoelectric material layer and metal layer(s) from the layered material stack.
Figure 13:
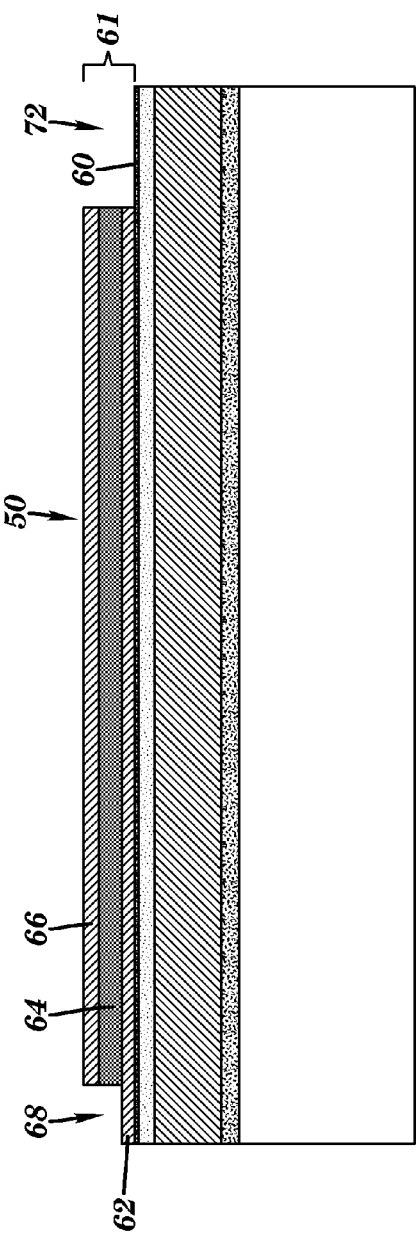
FIG. 13 is a side view of the layered material stack of FIG. 12, in which the first metal layer is patterned to remove a portion thereof from the layered material stack.

One embodiment of the method of making an energy harvester device of the present invention proceeds as illustrated in FIGS. 12-21. First, as shown in FIGS. 12-13, piezoelectric stack layer 61 is patterned. In particular, portions (e.g., portions 68 and 70) of piezoelectric material layer 64 and second metal layer 66 are removed from stack 50 to expose first metal layer 62.

Patterning piezoelectric stack layer 61 according to the method of the present invention may be accomplished using lithography techniques combined with wet etch with phosphoric acid for the metal layers and tetramethylamonium-hydroxide. Other suitable chemistries for wet or dry etching of the layers are also commonly used by persons of ordinary skill in the art and may be used in carrying out the method of the present invention.

According to one embodiment, patterning piezoelectric stack layer 61 involves removing portions of second metal layer 66 and piezoelectric material layer 64, and patterning first metal layer 62 to remove a portion thereof (e.g., portion 72) and to leave a further portion thereof exposed as an electrode. Patterning the electrode may be carried out using a phosphoric acid wet etch or a plasma (dry) etch with chlorine or fluorine gas. If an adhesion layer is present, the adhesion layer may be removed with a wet etch based ammonia peroxide (e.g., for a titanium adhesion layer). A top view of the resulting product of this embodiment of patterning piezoelectric stack layer 61 is illustrated in FIG. 17, where electrode 24 is shown exposed.

Figure 14:
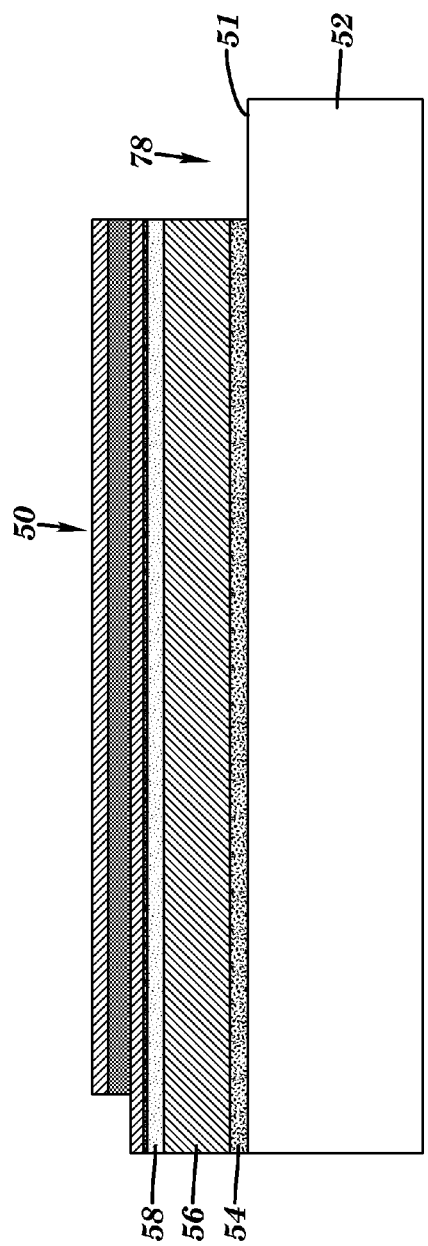
FIG. 14 is a side view of the layered material stack of FIG. 13, which has been further patterned, according to one embodiment of the method of producing an energy harvester device of the present invention, to remove portions of the second silicon dioxide layer, the cantilever material, and the first silicon dioxide layer from the layered material stack. Removing portions of the second silicon dioxide layer, the cantilever material, and the first silicon dioxide layer from the layered material stack may be carried out to form a cantilever material layer having side walls continuously curved within a single plane, as illustrated in the top view of FIG. 18.

Next, second silicon dioxide layer 58, cantilever material 56, and first silicon dioxide layer 54 are patterned. This method step is illustrated in FIG. 14. According to one embodiment, patterning silicon dioxide layer 58, cantilever material 56, and first silicon dioxide layer 54 involves removing a portion of second silicon dioxide layer 58, a portion of cantilever material 56, and a portion of first silicon dioxide layer 54 to leave portion 78 of first surface 51 of silicon wafer 52 exposed.

Patterning second silicon dioxide layer 58, cantilever material 56, and first silicon dioxide layer 54 may further involve removing opposing side walls of second silicon dioxide layer 58, cantilever material 56, and first silicon dioxide layer 54 to form a cantilever material layer having side walls continuously curved within a single plane. A top view of one embodiment of the resulting product of patterning silicon dioxide layer 58, cantilever material 56, and first silicon dioxide layer 54 is illustrated in FIG. 18, where portions 74 and 76 of side walls 14 are removed from second silicon dioxide layer 58, cantilever material 56, and first silicon dioxide layer 54 to form a layer that will become resonator beam 12. Electrode 24 (i.e., from layer 62) remains exposed.

According to one embodiment, this patterning may be done entirely with dry processes. For example, fluorine $CHF_3/CF_4$ gases and a reactive ion etch for the oxides and $SF_6/C_4F_8$ deep reactive ion etch for the polySi. For a metal, such as Cu, Au, or Ni, a wet etch process well known in the art can be used. Alternatively, the Cu, Ni, or Au are added via electroplating after patterning of the silicon layers.

Figure 15:
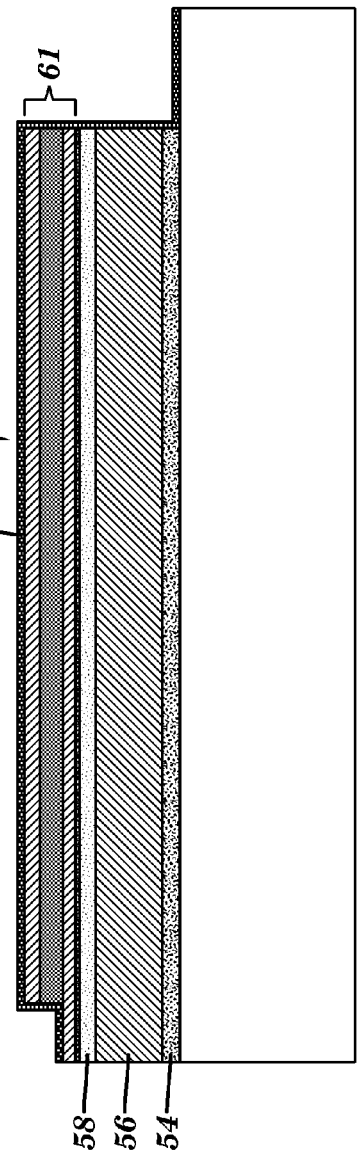
FIG. 15 is a side view of the layered material stack of FIG. 14, in which a third silicon dioxide layer has been deposited over the patterned piezoelectric stack layer and the patterned second silicon dioxide layer, cantilever material, and first silicon dioxide layer.

In a further (optional) method step illustrated in FIG. 15, third silicon dioxide layer 59 is deposited over the patterned piezoelectric stack layer 61 and the patterned second silicon dioxide layer 58, cantilever material 56, and first silicon dioxide layer 54. According to one embodiment, this step is carried out using plasma-enhanced chemical vapor deposition of silane (a silicon source) to deposit silicon for the passivation layer. This layer may be deposited to a thickness of about 1 μm. According to another embodiment, depositing the third silicon dioxide layer is an optional step that provides robustness to the structure against abrasion.

In the next method step illustrated in FIG. 16, when present, third silicon dioxide layer 59 is patterned. According to one embodiment, this step involves removing a portion of third silicon dioxide layer 59 to leave portions 68 and 69 of piezoelectric stack layer 61 and portion 78 of the silicon wafer exposed. According to one embodiment, this patterning is carried out using the $CHF_3$ reactive ion etch process.

A further (optional) method step is illustrated in FIG. 19, which illustrates metal bondpad layer 80 deposited over the patterned third silicon dioxide layer 59, as well as portion 68 of piezoelectric stack layer 61 and portion 78 of silicon wafer 52. Bondpad layer 80 provides a surface that allows for a robust wire bond to be formed to the device, ensuring good electrical connection. According to one embodiment, metal bondpad layer 80 is deposited to a thickness of about 1 μm, and is a metal material (e.g., Al). This layer is deposited to improve reliability of the wire bond.

FIG. 20 illustrates the next method step, which involves patterning metal bondpad layer 80 when present. According to one embodiment, metal bondpad layer 80 is patterned slightly longer than openings for top and bottom electrode connections. In one embodiment, patterning of metal bondpad layer 80 is carried out using wet etch chemistry based on phosphoric acid. However, other methods may also be used.

Figure 21:
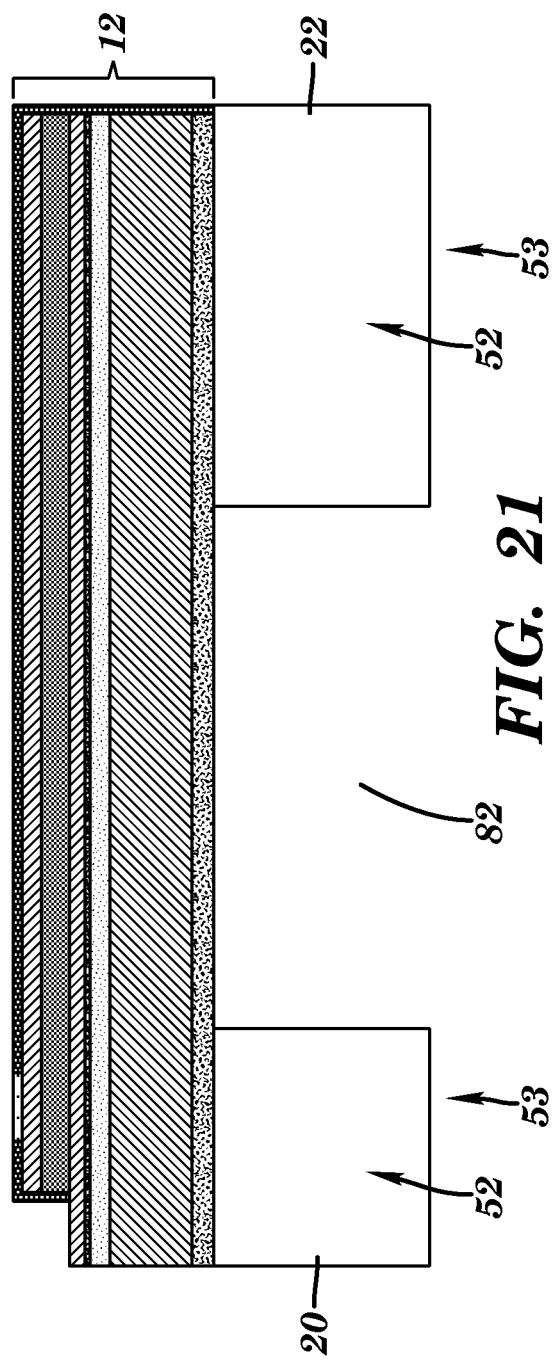
FIG. 21 is a side view of the layered material stack of FIG. 20, in which portions of the silicon wafer has been etched to create a resonator beam, a base, and a mass, thus creating one embodiment of the energy harvester device of the present invention.

The next process step is illustrated in FIG. 21, where silicon wafer 52 is etched at surface 53 to create resonator beam 12, base 20, and mass 22, thus producing one embodiment of the energy harvesting device of the present invention. In other words, portions of silicon wafer 52 are etched away to create a cavity 82 beneath what has become resonator beam 12 to create the separation between the portion of silicon wafer 52 that has become base 20 and portion of silicon wafer 52 that has become mass 22. According to one embodiment, etching silicon wafer 52 is carried out using lithography techniques and deep reactive ion etch with $SF_6/C_4F_8$ chemistry.

EXAMPLES

The following examples are provided to illustrate embodiments of the present invention but are by no means intended to limit its scope.

Example 1

Formation of the Cantilever of an Energy Harvester Device

Deposit Cantilever and Piezoelectric Stack Materials

The process starts with a double-sided polished silicon wafer having a thickness of 725 μm (+/−15 μm), which is the standard thickness for 8 inch wafers. 1 μm (+/−0.05 μm) of thermally grown $SiO_2$ is deposited onto one surface of the silicon wafer.

The cantilever material (e.g., electroplated metal or polySi deposited by chemical vapor deposition (CVD)) is deposited at a thickness range of 10-200 μm, most preferably 10-75 μm, and even more preferably 10-50 μm. The deposited surface is smoothed by chemical mechanical polish (if needed).

A 1 μm layer of silicon dioxide is deposited by CVD.

The piezoelectric stack (metal/AlN/metal) is deposited. The metal can be molybdenum or platinum deposited at a thickness of about 0.1 to about 0.5 μm, typically with a thin adhesion layer underneath as is standard in the art. The adhesion layer may comprise titanium, AlN, or Al at a thickness of about 0.02-0.05 μm. AlN can be deposited at a thickness of about 1 to 4 μm.

Pattern the Piezoelectric Stack Upper Electrode and AlN

The piezoelectric stack upper electrode is patterned using lithography combined with wet etch with phosphoric acid for the Mo and tetramethylamonium hydroxide (TMAH) (wet etch).

Pattern the Lower Electrode

Using phosphoric acid wet etch or a plasma (dry) etch with chlorine or fluorine gas, the lower electrode is patterned. If an adhesion layer is present, it may be removed at this point. To remove a titanium adhesion layer, a wet etch based on ammonia and peroxide can be used.

Pattern the Oxide/Cantilever/Oxide Stack

For a polySi or silicon cantilever, the oxide/cantilever/oxide stack can be patterned entirely with dry processes. For example, fluorine $CHF_3/CF_4$ gasses and a reactive ion etch ("RIE") for the oxides and $SF_6/C_4F_8$ deep reactive ion etch ("DRIE") for the polysilicon. For a metal such as copper or nickel, a wet etch process well known in the art can be used.

Deposit a PECVD TEOS for the Passivation Layer

An optional plasma enhanced chemical vapor deposition ("PECVD") tetraethylorthosilicate ("TEOS") layer may be deposited for a passivation layer at a thickness of about 1 μm. TEOS is essentially a form of $SiO_2$. This is an optional step that provides robustness to the structure against abrasion.

Pattern the PECVD TEOS to Open Up the Contacts for the Bondpads

Using a $CHF_3$ RIE process, the PECVD TEOS layer may be patterned to open up the contacts for the bondpads. The metal bondpad layer is deposited at a thickness of about 1 μm (Al). This improves the reliability of the wire bond.

Pattern the Metal Bondpad Layer

The metal bondpad layer is etched using wet etch chemistry based on phosphoric acid.

Define the Cantilever and Mass

The cantilever and mass is defined using lithography and DRIE with $SF_6/C_4F_8$ chemistry.

All of the features described herein (including any accompanying claims, abstract and drawings), and/or all of the steps of any method or process so disclosed, may be combined with any of the above aspects in any combination, except combinations where at least some of such features and/or steps are mutually exclusive.

What is claimed:

1. An energy harvester device comprising:
   an elongate, planar resonator beam comprising a piezoelectric material and side walls extending between first and second ends;
   a base connected to said resonator beam at the first end with the second end being freely extending from said base as a cantilever; and
   a mass attached to the second end of said resonator beam, wherein said side walls are continuously curved within the plane of said resonator beam.

2. The device according to claim 1, wherein said resonator beam comprises a laminate formed of a plurality of layers.

3. The device according to claim 2, wherein said plurality of layers comprise at least two different materials.

4. The device according to claim 1, wherein said side walls have a concave shape.

5. The device according to claim 1 further comprising:
   one or more electrodes in electrical contact with said piezoelectric material.

6. The device according to claim 5, wherein the one or more electrodes comprises a material selected from the group consisting of molybdenum and platinum.

7. The device according to claim 5 further comprising:
   electrical harvesting circuitry in electrical connection with the one or more electrodes to harvest electrical energy from said piezoelectric material.

8. The device according to claim 1, wherein the piezoelectric material is selected from the group consisting of aluminum nitride, zinc oxide, and lead zirconate titinate compounds.

9. A system comprising:
   an electrically powered apparatus and
   the device according to claim 1 electrically coupled to the apparatus.

10. The system according to claim 9, wherein said electrically powered apparatus is selected from the group consisting of a laptop computer; a tablet computer;
    a cell phone; a smart phone; an e-reader; an MP3 player; a telephony headset; headphones; a router; a gaming device; a gaming controller; a mobile internet adapter; a camera; wireless sensors; wireless sensor motes (for networks monitoring industrial, rail, buildings, agriculture, etc.), tire pressure sensor monitors; powering simple displays on power tools; agriculture devices for monitoring livestock; medical devices; human body monitoring devices; and toys.

11. The system according to claim 9, wherein said resonator beam comprises a laminate formed of a plurality of layers.

12. The system according to claim 11, wherein said plurality of layers comprise at least two different materials.

13. The system according to claim 9, wherein said side walls have a concave shape.

14. The system according to claim 9 further comprising:
    one or more electrodes in electrical contact with said piezoelectric material.

15. The system according to claim 14, wherein the one or more electrodes comprises a material selected from the group consisting of molybdenum and platinum.

16. The system according to claim 14 further comprising:
    electrical harvesting circuitry in electrical communication with the one or more electrodes to harvest electrical energy from said piezoelectric material.

17. The system according to claim 9, wherein the piezoelectric material is selected from the group consisting of aluminum nitride, zinc oxide, and lead zirconate titinate compounds.

18. A method of powering an electrically powered apparatus, said method comprising:
    providing the system according to claim 9;
    subjecting the system to movement or vibrations to generate electrical energy from said piezoelectric material; and
    transferring said electrical energy from said piezoelectric material to said apparatus to provide power to the apparatus.

19. The method according to claim 18, wherein said apparatus is selected from the group consisting of a laptop computer; a tablet computer; a cell phone; a smart phone; an e-reader; an MP3 player; a telephony headset; headphones; a router; a gaming device;
    a gaming controller; a mobile internet adapter; a camera; wireless sensors; wireless sensor motes (for networks monitoring industrial, rail, buildings, agriculture, etc.), tire pressure sensor monitors; powering simple displays on power tools; agriculture devices for monitoring livestock;
    medical devices; human body monitoring devices; and toys.

20. The method according to claim 18, wherein said side walls have a concave shape.

21. The method according to claim 18, wherein the system further comprises:
    one or more electrodes in electrical contact with said piezoelectric material.

22. The method according to claim 21, wherein the one or more electrodes comprises a material selected from the group consisting of molybdenum and platinum.

23. The method according to claim 21, wherein the system further comprises:
    electrical harvesting circuitry in electrical communication with the one or more electrodes to harvest electrical energy from said piezoelectric material.

24. The method according to claim 18, wherein the piezoelectric material is selected from the group consisting of aluminum nitride, zinc oxide, and lead zirconate titinate compounds.

* * * * *